United States Patent
Dreps

(10) Patent No.: US 10,944,391 B2
(45) Date of Patent: *Mar. 9, 2021

(54) OVERVOLTAGE PROTECTION CIRCUIT

(71) Applicant: INTERNATIONAL BUSINESS MACHINES CORPORATION, Armonk, NY (US)

(72) Inventor: Daniel M. Dreps, Georgetown, TX (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 20 days.

This patent is subject to a terminal disclaimer.

(21) Appl. No.: 16/167,898

(22) Filed: Oct. 23, 2018

(65) Prior Publication Data

US 2019/0058465 A1    Feb. 21, 2019

Related U.S. Application Data

(63) Continuation of application No. 15/723,491, filed on Oct. 3, 2017, now Pat. No. 10,177,755, which is a
(Continued)

(51) Int. Cl.
*H03K 17/04* (2006.01)
*G06F 13/40* (2006.01)
(Continued)

(52) U.S. Cl.
CPC .......... *H03K 17/04* (2013.01); *G06F 13/4072* (2013.01); *H02H 3/20* (2013.01);
(Continued)

(58) Field of Classification Search
CPC .... H03K 17/0822; H03K 17/687; H02H 3/20; H02H 3/303; H02H 3/32; G06F 13/4072; G06F 2213/0042; Y10T 29/413
(Continued)

(56) References Cited

U.S. PATENT DOCUMENTS

| 4,700,089 A | 10/1987 | Fuji et al. |
| 4,855,620 A | 8/1989 | Duvvury et al. |

(Continued)

FOREIGN PATENT DOCUMENTS

| CN | 101364731 | 2/2009 |
| CN | 101783343 | 7/2010 |

OTHER PUBLICATIONS

Semtech, "RClamp0504M Rail Clamp Low Capacity TVS Diode Array", Aug. 17, 2004; 10 Pages.
(Continued)

*Primary Examiner* — Kevin J Comber
(74) *Attorney, Agent, or Firm* — Steven Meyers; Andrew D. Wright; Roberts Calderon Safran & Cole, P.C.

(57) ABSTRACT

Universal Serial Bus (USB) protection circuits are provided. A circuit includes a plurality of first transistors connected in series between a pad and ground. The circuit also includes a plurality of second transistors connected in series between the pad and a supply voltage. The circuit further includes a control circuit that applies respective bias voltages to each one of the plurality of first transistors and to each one of the plurality of second transistors. The bias voltages are configured to: turn off the plurality of first transistors and turn off the plurality of second transistors when a pad voltage of the pad is within a nominal voltage range; sequentially turn on the plurality of first transistors when the pad voltage increases above the nominal voltage range; and sequentially turn on the plurality of second transistors when the pad voltage decreases below the nominal voltage range.

20 Claims, 6 Drawing Sheets

Related U.S. Application Data continuation of application No. 14/837,216, filed on Aug. 27, 2015, now Pat. No. 9,929,726, which is a continuation of application No. 13/840,061, filed on Mar. 15, 2013, now Pat. No. 9,219,473.

(51) Int. Cl.
| | |
|---|---|
| *H03K 17/082* | (2006.01) |
| *H02H 3/20* | (2006.01) |
| *H03K 17/687* | (2006.01) |
| *H05K 3/30* | (2006.01) |
| *H05K 3/32* | (2006.01) |

(52) U.S. Cl.
CPC ....... *H03K 17/0822* (2013.01); *H03K 17/687* (2013.01); *H05K 3/303* (2013.01); *H05K 3/32* (2013.01); *G06F 2213/0042* (2013.01)

(58) Field of Classification Search
USPC ....................................................... 361/91.1
See application file for complete search history.

(56) References Cited

U.S. PATENT DOCUMENTS

| | | |
|---|---|---|
| 5,287,241 A | 2/1994 | Puar |
| 5,570,043 A | 10/1996 | Churchill |
| 5,757,226 A | 5/1998 | Yamada et al. |
| 5,825,600 A | 10/1998 | Watt |
| 5,870,268 A | 2/1999 | Lin et al. |
| 5,963,409 A | 10/1999 | Chang |
| 5,973,544 A | 10/1999 | Ohno |
| 6,064,554 A | 5/2000 | Kim |
| 6,310,379 B1 | 10/2001 | Andersen et al. |
| 6,344,958 B1 | 2/2002 | Morrill |
| 6,388,495 B1 | 5/2002 | Roy et al. |
| 6,441,670 B1 | 8/2002 | Coughlin, Jr. et al. |
| 6,515,503 B2 | 2/2003 | Griffin et al. |
| 6,643,110 B2 | 11/2003 | Allen |
| 6,693,469 B2 | 2/2004 | Prodanov |
| 6,842,320 B1 | 1/2005 | Mathur et al. |
| 6,906,550 B2 | 6/2005 | Dreps et al. |
| 7,199,612 B2 | 4/2007 | Oertle et al. |
| 7,256,460 B2 | 8/2007 | Salling et al. |
| 7,521,966 B2 | 4/2009 | Chong et al. |
| 7,705,664 B2 | 4/2010 | Tang |
| 7,729,097 B2 | 6/2010 | Ramakrishna et al. |
| 7,835,124 B2 | 11/2010 | Siddhartha et al. |
| 8,166,222 B2 | 4/2012 | Garlapati et al. |
| 8,174,288 B2 | 5/2012 | Dennard et al. |
| 8,766,675 B1 | 7/2014 | Dreps et al. |
| 9,219,473 B2 | 12/2015 | Dreps |
| 2004/0240127 A1 | 12/2004 | Juliano et al. |
| 2010/0067158 A1 | 3/2010 | Saarinen |
| 2011/0122539 A1 | 5/2011 | Mann et al. |
| 2012/0299546 A1 | 11/2012 | Gagne et al. |
| 2013/0155565 A1 | 6/2013 | Zhou |
| 2014/0063666 A1 | 3/2014 | Kallal et al. |

OTHER PUBLICATIONS

Sanyo, http://www.soiseek.com/sanyo/vs003e4/, "VS003E4- Noise Clamp for Signal Line (for Low Voltage, USB2.0)", 2009; 2 Pages.
Compaq et al., "Universal Serial Bus Specification", Revision 2.0, Apr. 27, 2000; pp. i-ii and 119-194.

OVERVOLTAGE PROTECTION CIRCUIT

FIELD OF THE INVENTION

The invention relates to integrated circuits and, more particularly, to overvoltage protection circuits.

BACKGROUND

The Universal Serial Bus (USB) 3.0 interface requires backward compatibility to USB2. On the one hand, USB 2.0 input/output is designed with 3.3V signaling. On the other hand, USB 3.0 is a low voltage differential that uses separate pins. As complementary metal oxide semiconductor (CMOS) technologies advance to smaller devices, the support of 3.3V devices is becoming more difficult to achieve and adds process steps and cost to all technologies that are 32 nm and smaller. From a system on chip perspective, more of the hub type chip functions are being moved on the mainline processor or on a faster technology node hub chip. Integrating USB 2.0 and USB 3.0 onto the die is thus being requested.

Advanced technologies are tuned for logic performance, and a second thick oxide device is typically offered for other applications. As the base technology scales more aggressively, the thick oxide tends have lower voltage support. For example, many 32 nm thick oxide devices are nominally 1.8V devices. However, such 1.8V devices typically are not suitable for use with 3.3V circuits used in USB 2.0.

SUMMARY

In a first aspect of the invention, there is a circuit that includes a plurality of first transistors connected in series between a pad and ground. The circuit also includes a plurality of second transistors connected in series between the pad and a supply voltage. The circuit further includes a control circuit that applies respective bias voltages to each one of the plurality of first transistors and to each one of the plurality of second transistors. The bias voltages are configured to: turn off the plurality of first transistors and turn off the plurality of second transistors when a pad voltage of the pad is within a nominal voltage range; sequentially turn on the plurality of first transistors when the pad voltage increases above the nominal voltage range; and sequentially turn on the plurality of second transistors when the pad voltage decreases below the nominal voltage range.

In another aspect of the invention, there is a circuit that includes a pull down circuit comprising a first PFET and a second PFET connected in series between a pad of a Universal Serial Bus (USB) circuit and ground. The circuit also includes a pull up circuit comprising a first NFET and a second NFET connected in series between the pad and a supply voltage. The circuit further includes a control circuit that: sequentially turns on the first PFET and the second PFET during an overvoltage condition on the pad; and sequentially turns on the first NFET and the second NFET during an undervoltage condition on the pad. A pad voltage has a nominal minimum and a nominal maximum, and each of the first PFET, the second PFET, the first NFET, and the second NFET has a nominal voltage that is less than the pad voltage nominal maximum.

In another aspect of the invention, there is a method of protecting a circuit, the method including turning off a first PFET, a second PFET, a first NFET, and a second NFET based on a pad voltage of a differential signal line of a Universal Serial Bus (USB) circuit being within a range defined by a nominal minimum and a nominal maximum, wherein each of the first PFET, the second PFET, the first NFET, and the second NFET has a nominal voltage that is less than the nominal maximum. The method also includes clamping the pad voltage by sequentially turning on the first PFET and the second PFET based on the pad voltage increasing above the nominal maximum. The method further includes clamping the pad voltage by sequentially turning on the first NFET and the second NFET based on the pad voltage decreasing below the nominal minimum.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a circuit for recycling energy in a clock distribution network which comprises the structures of the present invention. In still further embodiments, a method in a computer-aided design system is provided for generating a functional design model of the protection circuit. The method comprises generating a functional representation of the structural elements of the protection circuit.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to overvoltage protection circuits. According to aspects of the invention, there is an overvoltage protection circuit for a USB transceiver having a nominal voltage, the overvoltage protection circuit being constructed with field effect transistors (FETs) having a nominal voltage less than an upper limit of the USB nominal voltage. In embodiments, the USB transceiver has a nominal voltage range of 3.3V and the overvoltage protection circuit comprises stacked 1.8V transistors. In implementations, the protection circuit includes plural 1.8V NFETs connected in series between a pad and rail voltage as a pull-up circuit, and plural 1.8V PFETs connected in series between the pad and ground as a pull-down circuit.

According to aspects of the invention, in an overvoltage situation, the total voltage between the pad and ground is apportioned substantially equally among the plural PFETs, such that each individual PFET has substantially the same drain-to-source voltage (VDS). In an undervoltage situation, the total voltage between the pad and rail is apportioned substantially equally among the plural NFETs, such that each individual PFET has substantially the same drain-to-source voltage (VDS). Bias voltages are applied to the gate of each NFET and PFET to control when each transistor turns on and off during an overvoltage or undervoltage event. The bias voltages and the number of NFETs and PFETs are configured to prevent the drain-to-source voltage of each transistor from exceeding the rated voltage for the transistor. In this manner, implementations of the invention utilize 1.8V devices to provide a protection circuit for a 3.3V USB 2.0 transceiver that may experience input signal overshoot of up to +4.6V (e.g., an overvoltage condition) and undershoot as low as −1.0V (e.g., an undervoltage condition).

Figure 1:
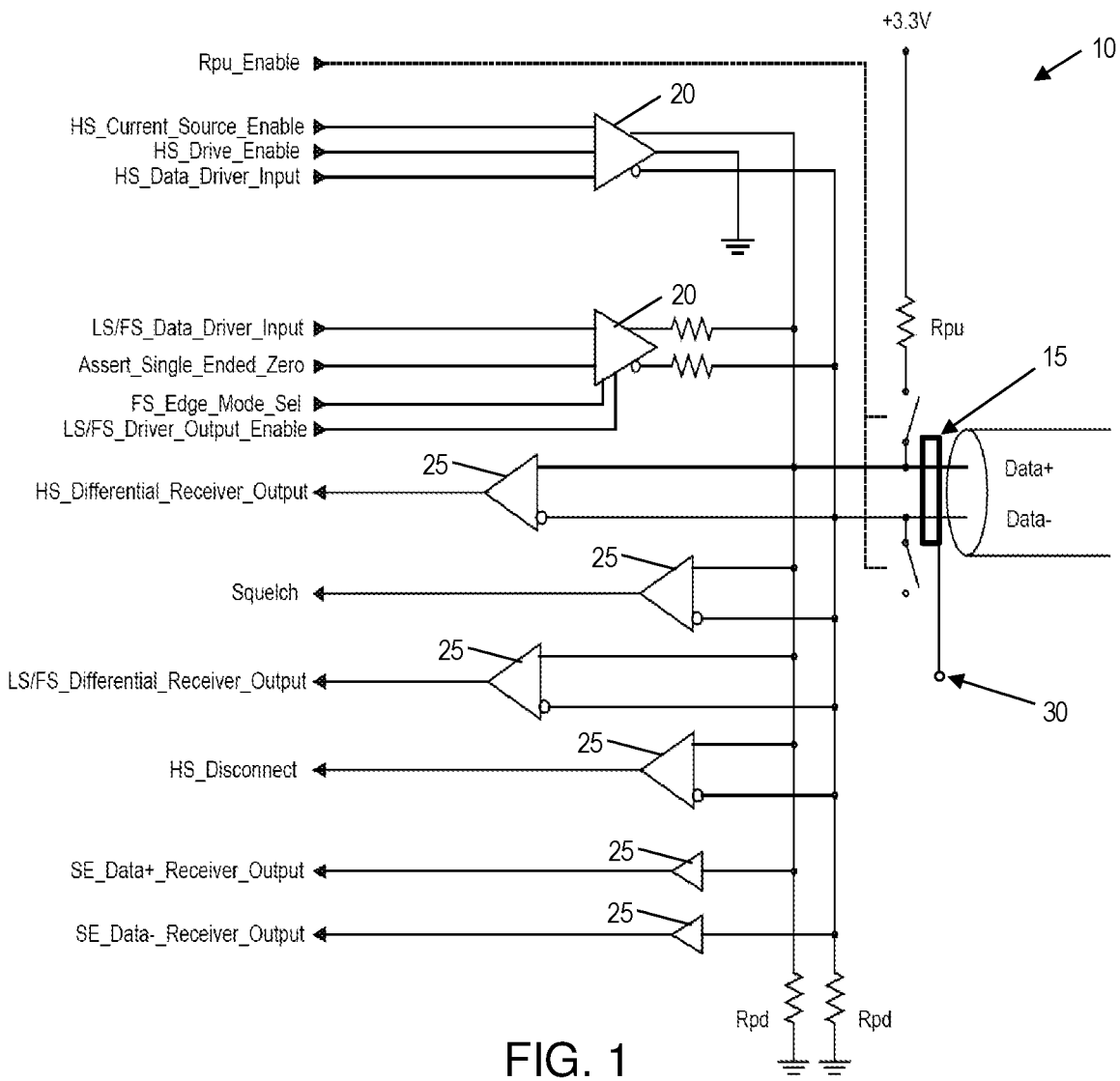
FIG. 1 shows a USB transceiver module with a circuit in accordance with aspects of the invention.

FIG. 1 shows a USB transceiver circuit 10 including a protection circuit 15 in accordance with aspects of the invention. The transceiver circuit 10 is a USB 2.0 circuit that includes conventional drivers 20 and receivers 25, and that has a nominal signal voltage between 0V and 3.3V. In embodiments, the protection circuit 15 is connected to differential signal lines (e.g., Data+ and Data− lines), and is formed internal to the transceiver circuit (e.g., in the same integrated circuit chip). In embodiments, the protection circuit 15 may include an enable/disable pin 30 so that the protection circuit 15 can be controlled to operate only in receiver mode and not in driver mode.

Figure 2:
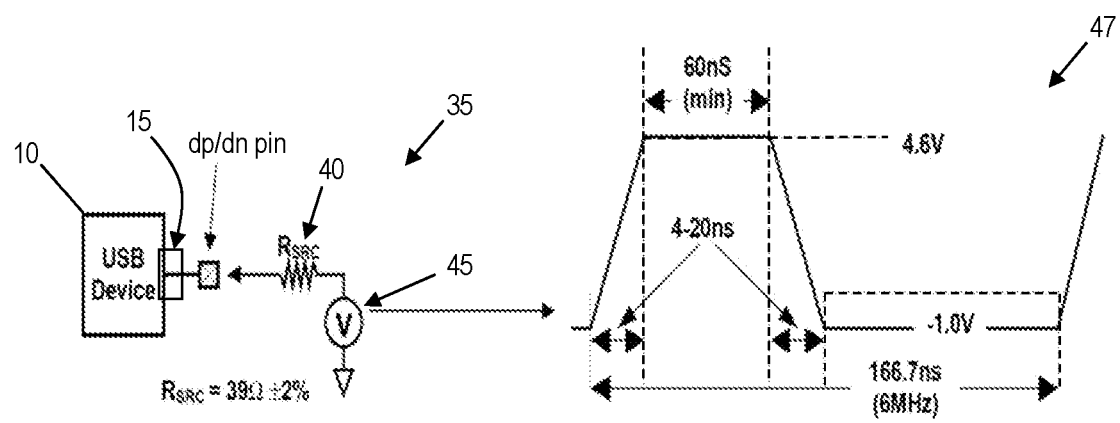
FIG. 2 shows an overvoltage and undervoltage test waveform that is applied to the circuit in accordance with aspects of the invention.

FIG. 2 shows the transceiver circuit 10 including the protection circuit 15 connected to a stress evaluation circuit 35. In embodiments, the Data+ or Data− (dp/dn) pin is connected to a resistance element 40 and a voltage source 45 that generates a waveform 47 with a −1.0V minimum and a +4.6V maximum. The resistance element 40 may be about 39 ohms, although the invention is not limited to this implementation. The stress evaluation circuit 35 represents the maximum input waveforms for compliance with the USB 2.0 specification. Implementations of the invention utilize 1.8V transistors in the protection circuit 15 to meet the stress criteria represented by the stress evaluation circuit 35, e.g., −1.0V undershoot and +4.6V overshoot in the input waveform with predefined transition times (e.g., 4-20 ns).

Figure 3:
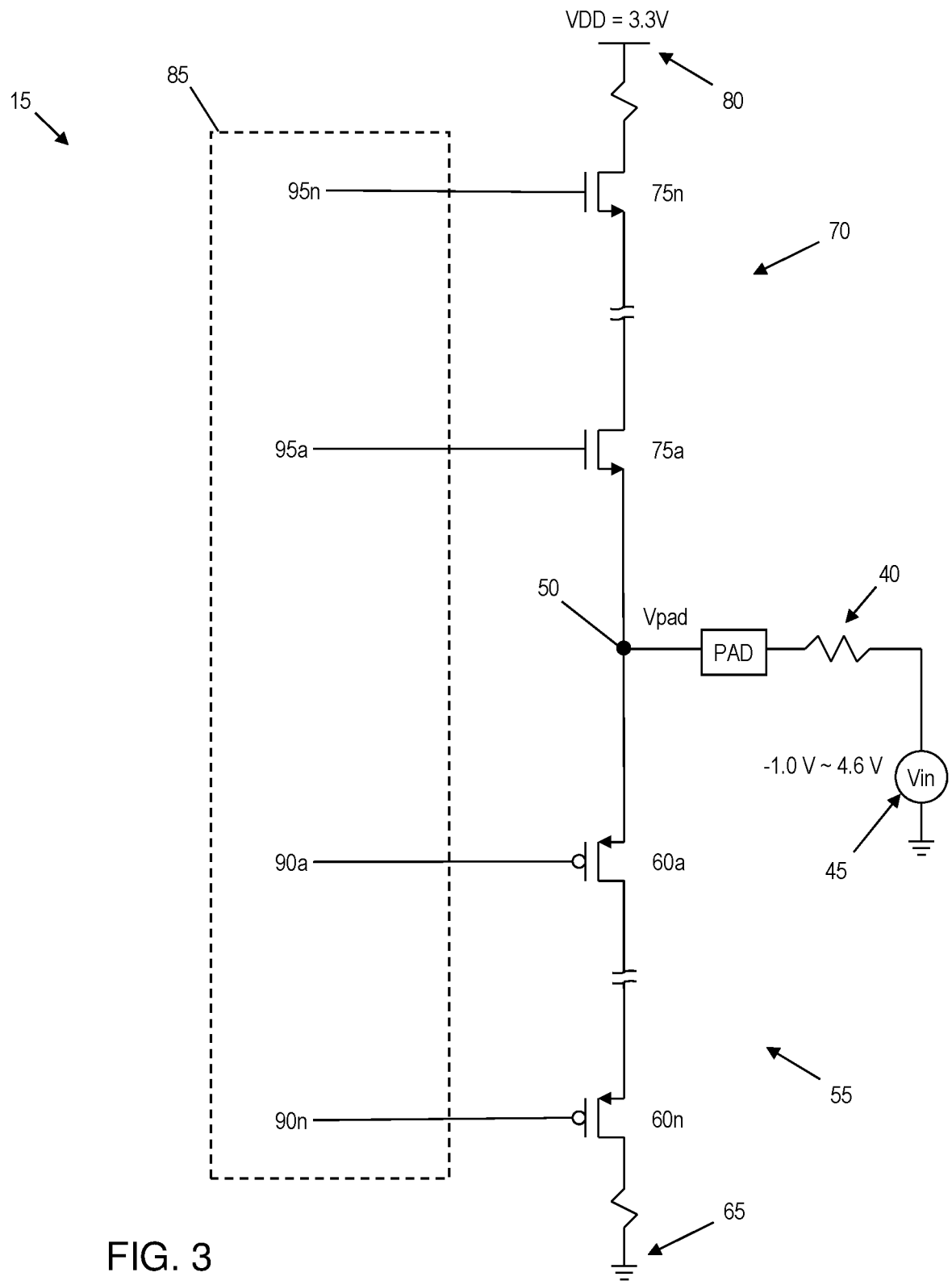
FIGS. 3-5 show diagrams of circuits in accordance with aspects of the invention.

FIG. 3 shows a block diagram of the protection circuit 15 in accordance with aspects of the invention. In embodiments, the circuit 15 includes a node 50 that corresponds to a pad (PAD) connected to one of the Data+ and Data− lines (e.g., dp/dn pin) of a USB transceiver circuit (e.g., circuit 10) downstream of the resistance element 40 and the voltage source 45. The pad has a pad voltage (Vpad) that is based on an input voltage (Vin) from the voltage source 45. A pull down clamping portion 55 of the circuit 15 includes plural p-type FET (PFET) devices 60a-n connected in series between the node 50 and ground 65. A pull up clamping portion 70 includes plural n-type FET (NFET) devices 75a-n connected in series between the node 50 and a voltage supply rail 80 (e.g., VDD).

In embodiments, VDD is 3.3V and all the devices 60a-n and 75a-n are 1.8V MOSFET devices (e.g., FETs having a nominal voltage of 1.8V). In embodiments, the number of transistors in each portion 55 and 70 equals two (n=2); however, the invention is not limited to this number, and any suitable number (n) may be used depending on parameters such as VDD and the design voltage of each transistor. For example, the number of transistors in each stack may be three or more (n>2), which permits the use of lower voltage transistors (e.g., 1.5V) for the same 3.3V VDD.

Still referring to FIG. 3, the protection circuit 15 includes a control portion 85 (e.g., a control circuit). In embodiments, the control portion 85 comprises circuitry that provides a respective bias voltage 90a-n to the gate of each PFET 60a-n, and that provides a respective bias voltage 95a-n to the gate of each NFET 75a-n. In accordance with aspects of the invention, the bias voltages 90a-n and 95a-n are configured to turn off the NFETs 75a-n and sequentially turn on the PFETs 60a-n as the voltage provided by the voltage source 45 rises above 3.3V to 4.6V (e.g., during an overvoltage condition) Also, the bias voltages 90a-n and 95a-n are configured to turn off the PFETs 60a-n and sequentially turn on the NFETs 75a-n as the voltage provided by the voltage source 45 falls below 0.0V to −1.0V (e.g., during an undervoltage condition).

In embodiments, the bias voltages 90a-n and the threshold voltages of the PFETs 60a-n are structured and arranged such that the total voltage from Vpad to ground is apportioned substantially equally among the PFETs 60a-n during an overshoot condition (e.g., when Vin=4.6V), and further such that the drain to source voltage (VDS) of each PFET 60a-n does not exceed 1.8V during the overshoot condition. Similarly, the bias voltages 95a-n and the threshold voltages of the NFETs 75a-n are structured and arranged such that the total voltage from Vpad to VDD is apportioned substantially equally among the NFETs 60a-n during an undershoot condition (e.g., when Vin=−1.0V), and further such that the drain to source voltage (VDS) of each NFET 75a-n does not exceed 1.8V during the undershoot condition. In this manner, implementations of the invention utilize 1.8V transistors to provide overvoltage and undervoltage protection for a 3.3V USB transceiver circuit.

Figure 4:
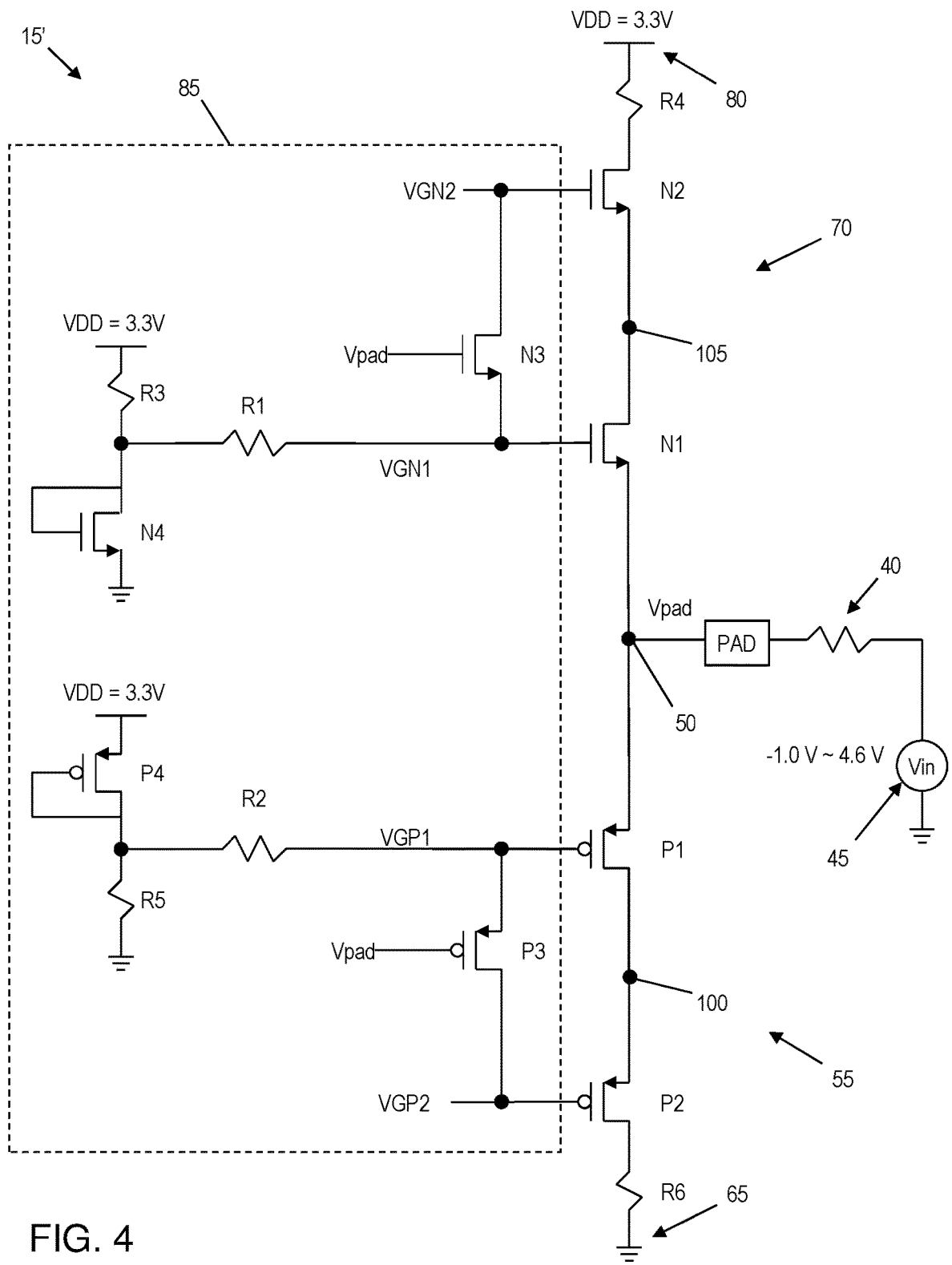

FIG. 4 shows an exemplary implementation of the protection circuit 15' in accordance with aspects of the invention. In embodiments, there are two transistors (n=2) in each clamping portion 55 and 70, such that 1.8V PFETs P1 and P2 are connected in series between the node 50 and ground 65 and 1.8V NFETs N1 and N2 are connected in series between the node 50 and rail voltage 80 (VDD). The control portion 85 applies bias voltage VGP1 to the gate of P1, bias voltage VGP2 to the gate of P2, bias voltage VGN1 to the gate of N1 and bias voltage VGN2 to the gate of N2.

In embodiments, a source of NFET N3 is connected to the gate of N1, and a drain of N3 is connected to the gate of N2. The pad voltage Vpad is applied to the gate of N3. The gate of N1 is also connected to a voltage divider via a resistor R1, the voltage divider including a resistor R3 and a gate-drain connected NFET N4 connected in series between VDD and ground. Similarly, a source of PFET P3 is connected to the gate of P1, and a drain of P3 is connected to the gate of P2. The pad voltage Vpad is applied to the gate of P3. The gate of P1 is also connected to a voltage divider via a resistor R2, the voltage divider including a resistor R5 and a gate-drain connected PFET P4 connected in series between VDD and ground.

In accordance with aspects of the invention, R3, N4, and R1 are sized to cause VGN1 to be about 1.8V. Similarly, R5, P4, and R2 are sized to cause VGP1 to be about 1.8V. VGN2 and VGP2 are steady state DC voltages that are slightly less than VGN1 and VGP1, respectively. For example, VGN2 and VGP2 may be derived from VDD using a voltage divider or other suitable circuit and may have a value in a range of about 1.5V to 1.7V when VGN1 and VGP1 are 1.8V. The invention is not limited to these particular voltages, however, and any suitable bias voltages VGN1, VGN2, VGP1, and VGP2 may be used within the scope of the invention.

Still referring to FIG. 4, P1 and VGP1 are configured such that P1 is off when Vin is between 0.0V and 3.3V. Similarly, N1 and VGN1 are configured such that N1 is off when Vin is between 0.0V and 3.3V. In this manner, the pull down portion 55 and the pull up portion 70 are both off when Vin is in the normal 0.0V to 3.3V operating range.

In operation during an overvoltage condition Vin rises above 3.3V toward 4.6V, which causes Vpad to increase above an upper threshold of normal operation (e.g., above VDD). N1 remains off in this condition since its source voltage (Vpad) exceeds its gate voltage VGN1 (e.g., about 1.8V), and this keeps the pull up portion 70 turned off. P1 on the other hand turns on when Vpad sufficiently exceeds VGP1 due to Vin rising past 3.3V. In embodiments, P2 does not turn on simultaneously with P1. Rather, the threshold voltage of P2 and the magnitude of VGP2 are configured such that P2 remains off for a time after P1 has started conducting. However, as Vpad continues to rise (e.g., due to Vin continuing to rise toward 4.6V), the voltage at node 100 between P1 and P2 (e.g., at the source of P2) eventually rises higher than VGP2 (e.g., at the gate of P2), and this causes P2 to begin conducting, which completes a conductive path between node 50 and ground 65 that pulls down Vpad to within tolerable limits (e.g., clamps Vpad).

Conversely, during an undervoltage condition Vin falls below 0.0V toward −1.0V, which causes Vpad to decrease below a lower threshold of normal operation (e.g., below ground). P1 is off in this condition since its source voltage (Vpad) is less than its gate voltage VGP1 (e.g., about 1.8V), and this keeps the pull down portion 55 turned off. N1 on the other hand turns on when Vpad sufficiently falls below VGN1. Similar to the sequential turning on of P1 and P2, the threshold voltage of N2 and the magnitude of VGN2 are configured such that N2 remains off for a time after N1 has started conducting. However, as Vpad continues to fall (e.g., due to Vin continuing to fall toward −1.0V), the voltage at node 105 between N1 and N2 (e.g., at the source of N2) eventually falls lower than VGN2 (e.g., at the gate of N2), and this causes N2 to begin conducting, which completes a conductive path between node 50 and VDD that pulls up Vpad to within tolerable limits (e.g., clamps Vpad).

In embodiments, the threshold voltages of P1 and P2 and the magnitudes of VGP1 and VGP2 are configured such that the gate to source voltage (VGS) and drain to source voltage (VDS) of each of P1 and P2 do not exceed 1.8V during an overvoltage condition. For example, when P1 and P2 are both on, the voltage across each is substantially equal to (Vpad-ground)/(n) where n=2 in this example. In this manner, when Vin rises to the maximum of 4.6V, a corresponding Vpad of 3.6V is apportioned substantially evenly between P1 and P2 such that each one of P1 and P2 has a VDS of about 1.8V. The threshold voltages of N1 and N2 and the magnitudes of VGN1 and VGN2 are also configured such that the gate to source voltage (VGS) and drain to source voltage (VDS) of each of N1 and N2 do not exceed 1.8V during an undervoltage condition. In this manner, 1.8V devices may be used in a clamping circuit (e.g., the protection circuit) of a 3.3V USB 2.0 transceiver circuit, i.e., the protection devices have a nominal voltage (1.8V) that is less than the nominal maximum voltage of the transceiver circuit (3.3V).

Still referring to FIG. 4, the circuit 15' may include resistance element R4 between N2 and VDD and resistance element R6 between P2 and ground. In embodiments, the magnitude of resistance provided by R4 is chosen to set the point of node 105 as an impedance divider of N1 and N2. Similarly, the magnitude of resistance provided by R6 is chosen to set the point of node 100 as an impedance divider of P1 and P2. Node 100 self-biases when P1 and P2 are off, and node 105 self-biases when N1 and N2 are off.

Further, resistance elements R2 and R1 are set to drop about 100 to 200 mV according to the following equations in which IDS is the drain-to-source current and VDS is the drain-to-source voltage:

$$100\text{-}200mV = IDS_{P3}*R2 \text{ when } VDS_{P3} < 0.5V \quad (1)$$

$$100\text{-}200mV = IDS_{N3}*R1 \text{ when } VDS_{N3} < 0.5V \quad (2)$$

The magnitudes of resistance elements R3 and R5 may be chosen to set the level of VGP1 and VGN1. For example, VGP1 is set by $IDS_{P4}*R5$ when P3 is off, and VGN1 is set by $(VDD-IDS_{N4})*R3$ when N3 is off.

With continued reference to FIG. 4, N3 provides a modulation of VGN1 and P3 provides a modulation of VGP1. In embodiments, VGP1 is about 1.8V, VGP2 is less than VGP1, and P3 provides about 100-200 mV modulation of VGP1 when P3 is on. This modulation pulls VGP1 closer to VGP2 (e.g., lower VGP1 when P3 is on), which affects the gate voltage of P1, which can be used to set the point at which P1 starts to conduct when Vpad goes high. Similarly, when VGN1 is about 1.8V and VGN2 is less than VGN1, N3 provides about 100-200 mV modulation of VGN1 when N3 is on. This modulation pulls VGN1 closer to VGN2, which affects the gate voltage of N1, which can be used to set the point at which N1 starts to conduct when Vpad goes low.

Figure 5:
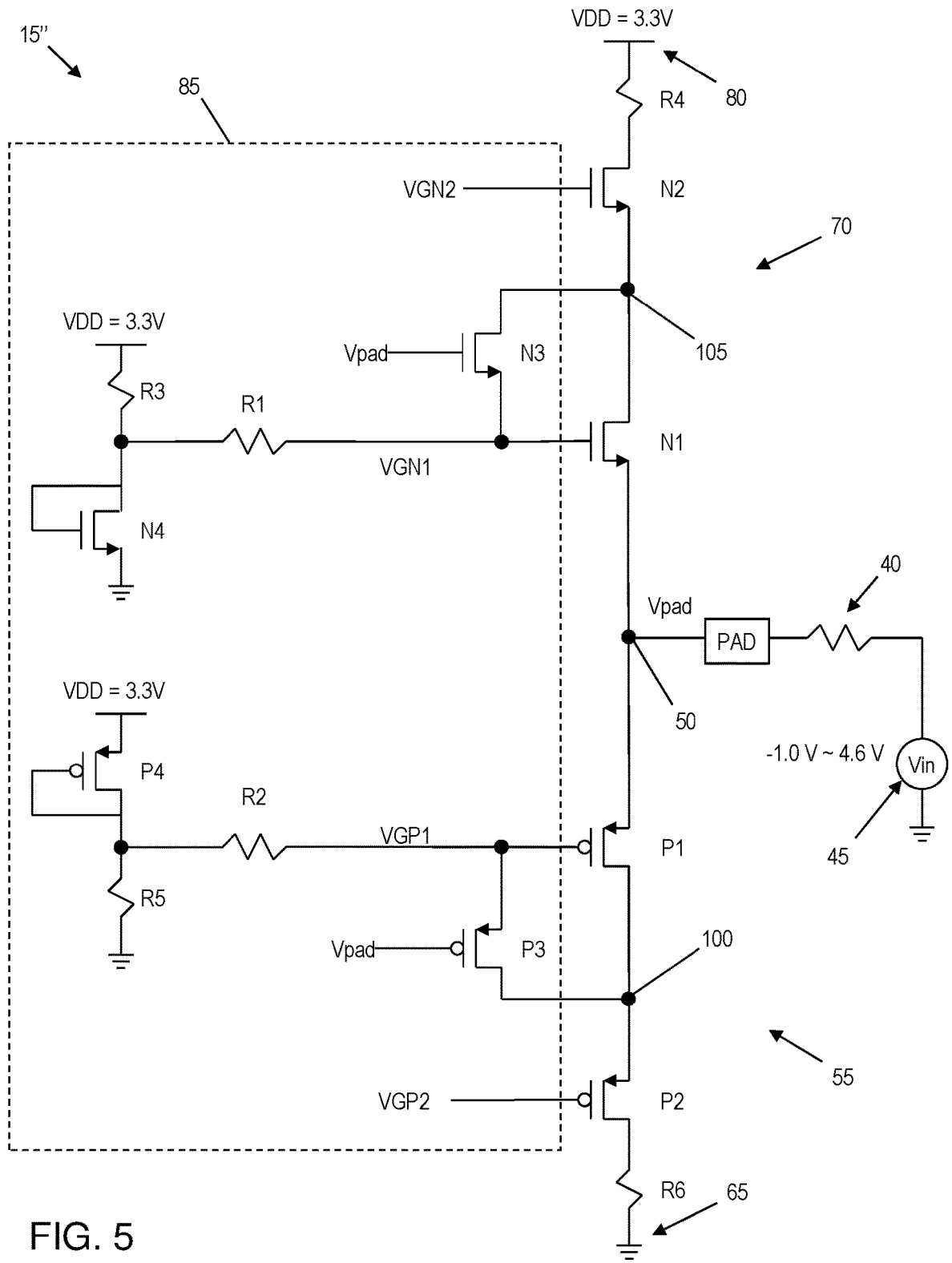

FIG. 5 shows another exemplary implementation of a protection circuit 15" in accordance with aspects of the invention. The protection circuit 15" of FIG. 5 contains the same elements as the circuit 15' of FIG. 4 and like reference numbers indicate the same elements. In circuit 15" the drain of N3 is connected to node 105 between N1 and N2 (instead of being connected to the gate of N2 as in circuit 15'). Also, in circuit 15" the drain of P3 is connected to node 100 between P1 and P2 (instead of being connected to the gate of P2 as in circuit 15'). In this manner, P3 provides a fixed bias to node 105 when P3 is on. In particular, the voltage at node 100 is pulled to VGP1 when P3 turns on (e.g., when Vpad goes low and P1 is off), and this rise above ground at node 100 provides voltage protection for P1 by biasing the drain voltage of P1 to about 1.8V prior to P1 seeing a source voltage of about 3.6V when Vpad subsequently swings high. Similarly, N3 provides a fixed bias to node 105 when N3 is on. In particular, the voltage at node 105 is pulled to VGN1 when N3 turns on (e.g., when Vpad goes high and N1 is off), and this decrease from VDD at node 105 provides voltage protection for N1 by biasing the drain voltage of N1 prior to N1 seeing a source voltage of about −1.0V when Vpad subsequently swings low.

Figure 6:
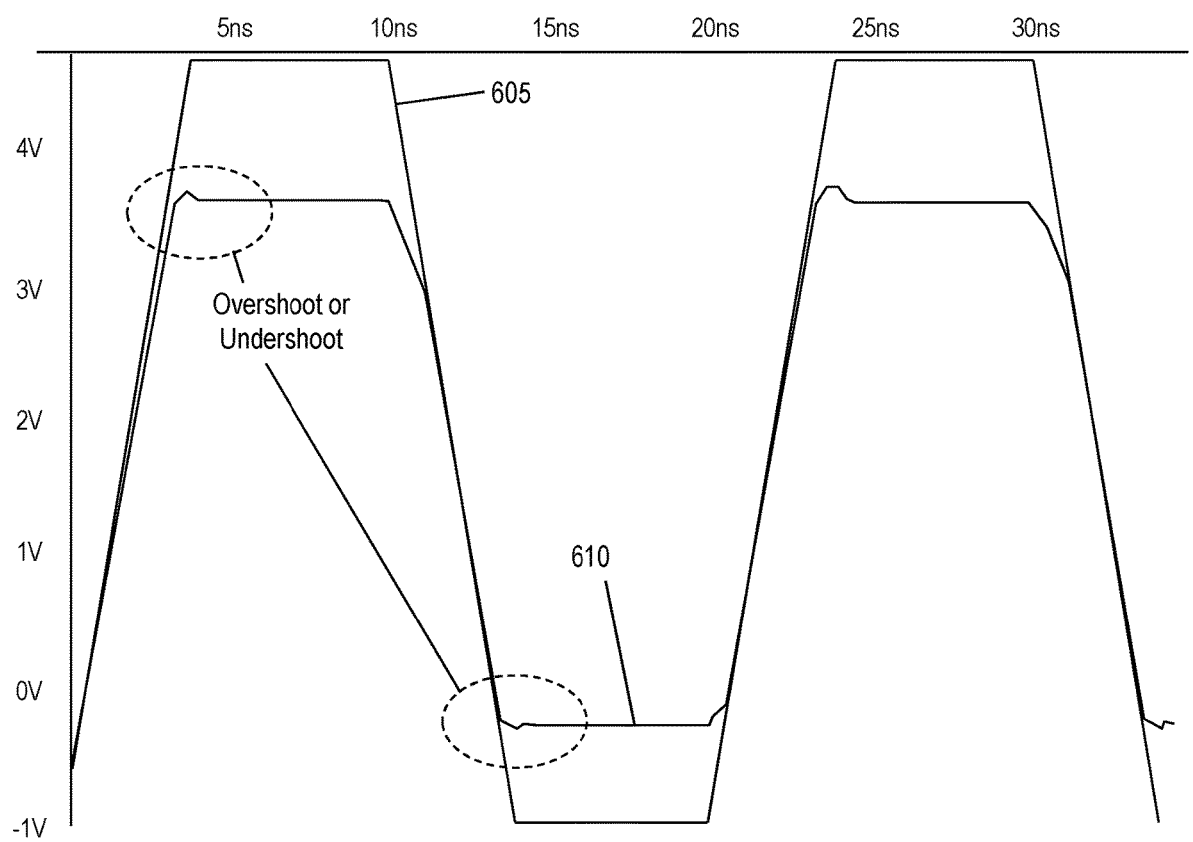
FIG. 6 shows simulation data of the operation of a circuit in accordance with aspects of the invention.

FIG. 6 shows a plot of voltage Vin at line 605 and the voltage at dp/dn at line 610 in circuit 15'. The plot depicts clamping that reduces the 4.6V and −1.0V using two stacked 1.8V devices in accordance with aspects of the invention.

Figure 7:
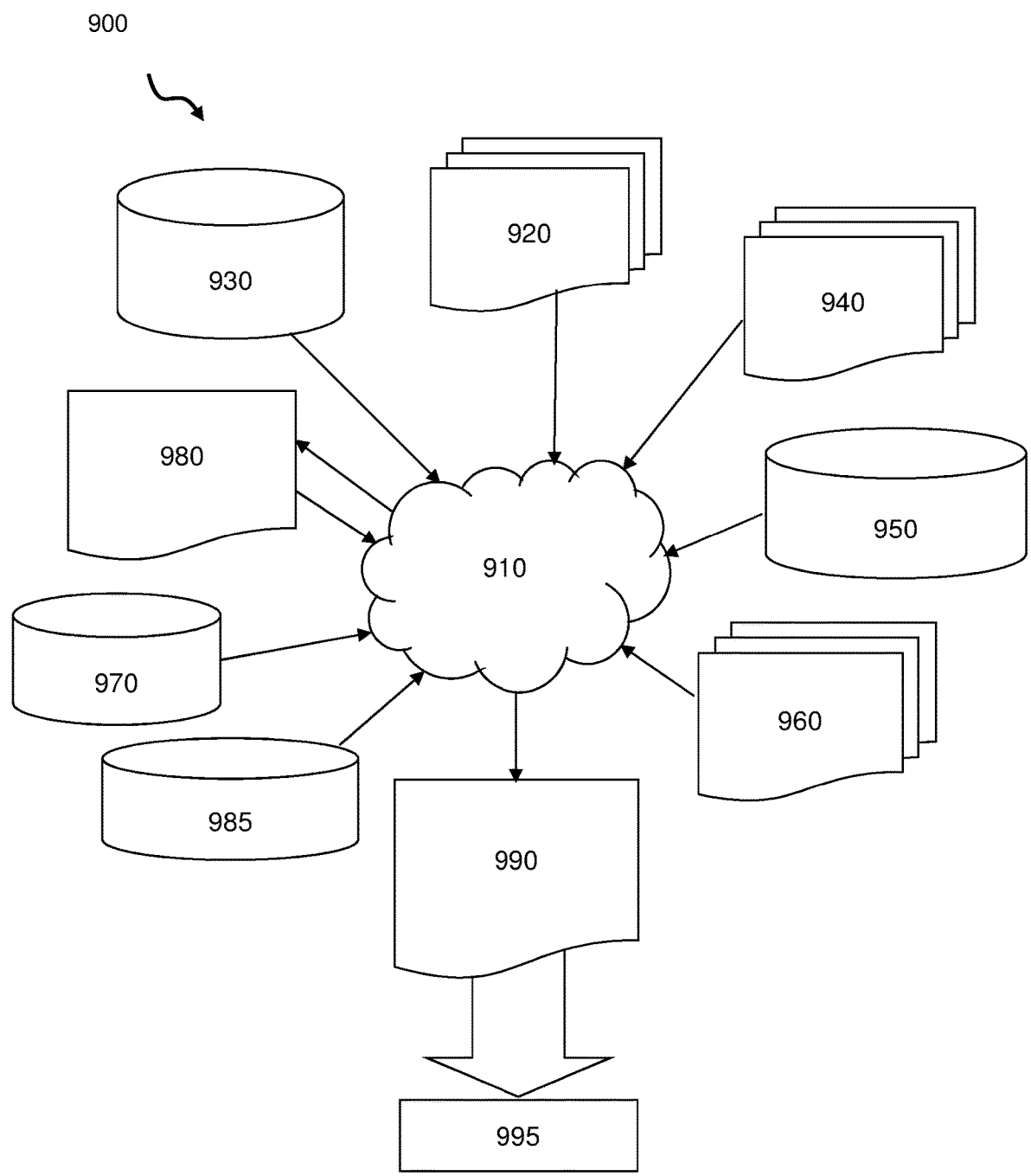
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 3-5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 3-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3-5. In one embodiment, design structure 990 may comprise a compiled, executable HDL simulation model that functionally simulates the devices shown in FIGS. 3-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3-5. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of manufacturing a circuit, comprising:
    forming a first PFET and a second PFET connected in series between a pad having a pad voltage and ground;
    forming a first NFET and a second NFET connected in series between the pad and a supply voltage;
    forming a third PFET, wherein a source of the third PFET is connected to a gate of the first PFET, and the pad voltage is applied to a gate of the third PFET;
    forming a third NFET, wherein a source of the third NFET is connected to a gate of the first NFET, and the pad voltage is applied to a gate of the third NFET;
    forming a first voltage divider connected to the gate of the first PFET; and
    forming a second voltage divider connected to the gate of the first NFET.

2. The method of manufacturing the circuit of claim 1, further comprising:
    forming a first resistance element connected between a drain of the second PFET and ground; and
    forming a second resistance element connected between a drain of the second NFET and the supply voltage.

3. The method of manufacturing the circuit of claim 1, wherein:
    a first bias voltage is applied to the gate of the first PFET;
    a second bias voltage, less than the first bias voltage, is applied to the gate of the second PFET;
    a third bias voltage is applied to the gate of the first NFET; and
    a fourth bias voltage, less than the third bias voltage, is applied to the gate of the second NFET.

4. The method of manufacturing the circuit of claim 3, wherein:
    the first bias voltage is an output of the first voltage divider; and
    the third bias voltage is an output of the second voltage divider.

5. The method of manufacturing the circuit of claim 1, wherein the first voltage divider comprises a voltage divider first element and a voltage divider second element connected in series, wherein the gate of the first PFET is connected to a node between the voltage divider first element and the voltage divider second element.

6. The method of manufacturing the circuit of claim 5, wherein the voltage divider first element and the voltage divider second element comprise a resistor and a transistor connected in series between the supply voltage and the ground.

7. A method of manufacturing a circuit, comprising:
    forming a first PFET and a second PFET connected in series between a pad having a pad voltage and ground;
    forming a first NFET and a second NFET connected in series between the pad and a supply voltage;
    forming a third PFET, wherein a source of the third PFET is connected to a gate of the first PFET, and the pad voltage is applied to a gate of the third PFET;
    forming a third NFET, wherein a source of the third NFET is connected to a gate of the first NFET, and the pad voltage is applied to a gate of the third NFET;
    forming a first voltage divider connected to the gate of the first PFET; and
    forming a second voltage divider connected to the gate of the first NFET,
    wherein a drain of the third PFET is connected to a gate of the second PFET; and
    a drain of the third NFET is connected to a gate of the second NFET.

8. The method of manufacturing the circuit of claim 7, further comprising:
    forming a first resistance element connected between a drain of the second PFET and ground; and
    forming a second resistance element connected between a drain of the second NFET and the supply voltage.

9. The method of manufacturing the circuit of claim 7, wherein:
    a first bias voltage is applied to the gate of the first PFET;
    a second bias voltage, less than the first bias voltage, is applied to the gate of the second PFET;
    a third bias voltage is applied to the gate of the first NFET; and
    a fourth bias voltage, less than the third bias voltage, is applied to the gate of the second NFET.

10. The method of manufacturing the circuit of claim 9, wherein:
    the first bias voltage is an output of the first voltage divider; and
    the third bias voltage is an output of the second voltage divider.

11. The method of manufacturing the circuit of claim 7, wherein the first voltage divider comprises a voltage divider first element and a voltage divider second element connected in series, wherein the gate of the first PFET is connected to a node between the voltage divider first element and the voltage divider second element.

12. The method of manufacturing the circuit of claim 11, wherein the voltage divider first element and the voltage divider second element comprise a resistor and a transistor connected in series between the supply voltage and the ground.

13. The method of manufacturing the circuit of claim 7, wherein the second voltage divider comprises a gate-drain connected NFET.

14. A method of manufacturing a circuit, comprising:
forming a first PFET and a second PFET connected in series between a pad having a pad voltage and ground;
forming a first NFET and a second NFET connected in series between the pad and a supply voltage;
forming a third PFET, wherein a source of the third PFET is connected to a gate of the first PFET, and the pad voltage is applied to a gate of the third PFET; and
forming a third NFET, wherein a source of the third NFET is connected to a gate of the first NFET, and the pad voltage is applied to a gate of the third NFET;
forming a first voltage divider connected to the gate of the first PFET; and
forming a second voltage divider connected to the gate of the first NFET, wherein a drain of the third PFET is connected to a drain of the first PFET and a source of the second PFET; and
a drain of the third NFET is connected to a drain of the first NFET and a source of the second NFET.

15. The method of manufacturing the circuit of claim 14, further comprising:
forming a first resistance element connected between a drain of the second PFET and ground; and
forming a second resistance element connected between a drain of the second NFET and the supply voltage.

16. The method of manufacturing the circuit of claim 14, wherein:
a first bias voltage is applied to the gate of the first PFET;
a second bias voltage, less than the first bias voltage, is applied to the gate of the second PFET;
a third bias voltage is applied to the gate of the first NFET; and
a fourth bias voltage, less than the third bias voltage, is applied to the gate of the second NFET.

17. The method of manufacturing the circuit of claim 16, wherein:
the first bias voltage is an output of the first voltage divider; and
the third bias voltage is an output of the second voltage divider.

18. The method of manufacturing the circuit of claim 14, wherein the first voltage divider comprises a voltage divider first element and a voltage divider second element connected in series, wherein the gate of the first PFET is connected to a node between the voltage divider first element and the voltage divider second element.

19. The method of manufacturing the circuit of claim 18, wherein the voltage divider first element and the voltage divider second element comprise a resistor and a transistor connected in series between the supply voltage and the ground.

20. The method of manufacturing the circuit of claim 14, wherein the second voltage divider comprises a gate-drain connected NFET.

\* \* \* \* \*